United States Patent
Huang

(10) Patent No.: US 7,793,169 B2
(45) Date of Patent: Sep. 7, 2010

(54) INTELLIGENT TABLE-DRIVEN INTERLEAVING

(75) Inventor: Wensheng Huang, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1191 days.

(21) Appl. No.: 11/253,407

(22) Filed: Oct. 19, 2005

(65) Prior Publication Data

US 2007/0101210 A1    May 3, 2007

(51) Int. Cl.
  G06F 11/00    (2006.01)
(52) U.S. Cl. .................................. 714/701; 711/157
(58) Field of Classification Search .............. 714/701; 711/157
  See application file for complete search history.

(56) References Cited

U.S. PATENT DOCUMENTS

| | | | |
|---|---|---|---|
| 3,652,998 A | | 3/1972 | Forney, Jr. |
| 5,648,967 A | * | 7/1997 | Schulz ........................ 370/328 |
| 5,991,857 A | * | 11/1999 | Koetje et al. ................. 711/157 |
| 6,493,815 B1 | | 12/2002 | Kim et al. |
| 6,529,730 B1 | * | 3/2003 | Komaili et al. ............ 455/452.2 |
| 6,543,013 B1 | | 4/2003 | Li et al. |
| 6,813,252 B2 | * | 11/2004 | Chang et al. ................. 370/294 |
| 2002/0087923 A1 | * | 7/2002 | Eroz et al. .................... 714/702 |
| 2002/0149496 A1 | | 10/2002 | Dabak et al. |
| 2003/0163776 A1 | | 8/2003 | Prasad |
| 2004/0025102 A1 | | 2/2004 | Yokokawa et al. |
| 2010/0033355 A1 | * | 2/2010 | Dinoi et al. .................... 341/81 |

FOREIGN PATENT DOCUMENTS

| | | |
|---|---|---|
| EP | 0 660 558 | 6/1995 |
| EP | 1 039 646 | 9/2000 |

OTHER PUBLICATIONS

Sun, J, Takeshita, O. Y., Interleavers for turbo codes using permutation polynomials over integer rings, Jan. 2005, IEEE, vol. 51, pp. 101-102.*
F. Daneshgaran and M. Mondin, "Design of interleavers for turbo codes:Iterative interleaver growth algorithms of polynomial complexity," Sep. 1999, IEEE, vol. 45.*
Sajadpour, H.R., Interleaver desgin for turbo codes, May 2001, IEEE, vol. 19, pp. 832-833.*

* cited by examiner

Primary Examiner—Scott T Baderman
Assistant Examiner—Enam Ahmed
(74) Attorney, Agent, or Firm—Coats & Bennett, P.L.L.C.

(57) ABSTRACT

The present invention comprises an interleaver that uses a reduced interleaving table to generate interleaved output data blocks from input data blocks. By iteratively applying the reduced interleaving table to bits in the input data blocks, the interleaver generates output data blocks equivalent to those that would have been generated using a full-size interleaving table. According to one embodiment of the present invention, the interleaving circuit includes a grouping circuit, a permuting circuit, and a mapping circuit. The grouping circuit groups the bits of each data block into a plurality of sub-blocks, while the permuting circuit independently permutes the data bits in each sub-block using the reduced interleaving table to generate permuted sub-blocks. The mapping circuit maps the bits from each permuted sub-block to one or more output data blocks, where the bits in each output data block may comprise bits from different sub-blocks and/or different input data blocks.

44 Claims, 6 Drawing Sheets

INTELLIGENT TABLE-DRIVEN INTERLEAVING

BACKGROUND

This invention relates generally to a digital communication system, and more particularly to interleavers and de-interleavers in a wireless digital communication system.

In digital communication, noise and interference cause bit errors to occur during transmission. In order to reduce these bit errors, digital communication systems typically use error control codes that enable the detection and/or correction of the bit errors at the receiver. These error control codes introduce controlled redundancy into the information transmitted over the communication channel, which can be used at the receiver to detect and/or correct the errors in the received signal.

Convolutional codes represent one type of error control code used by digital communication systems to detect and correct bit errors. Convolutional codes effectively detect and correct random bit errors that occur when individual bits in the transmitted bit sequence are corrupted. Random errors are typically isolated and may be caused by noise in the communication channel. However, convolutional codes are susceptible to burst errors, which occur when the receiver receives a series of adjacent or closely spaced bits in error.

To enhance the burst error correction capabilities of error correcting codes, such as convolutional codes, digital communication systems may include an interleaver and de-interleaver. The interleaver maps input bit positions in an input data block to corresponding output bit positions in an output data block according to a known interleaving pattern. As a result, the interleaver reorders the bits to spread the bits over time. This reordering effectively spreads long burst errors over the output data block(s) to make the burst errors appear as independent random bit errors.

Communication systems typically use either a look-up method or a calculation method to perform interleaving and de-interleaving. The look-up method uses an interleaving table containing pre-calculated mapping values for each input bit. The values in the interleaving table map the bits in an input data block to output bit positions in an output data block. As a result, the interleaver/de-interleaver determines the output bit position for each input bit by a simple look-up operation. Implementing the look-up method requires minimal processing resources, but requires a relatively large amount of memory.

The calculation method uses an interleaving algorithm to calculate the output bit positions for each bit in the input data block in real time, and may be used when the mapping function can be expressed in closed form. While the calculation method requires little to no memory, it does require more processing resources.

Memory limitations often constrain the design of chip sets for digital communication systems more than limitations in the available processing resources. Therefore, in such systems, the look-up approach is inappropriate. However, because processing resources have higher power consumption and cost more than memory resources, achieving a better balance between memory and processing resources may help reduce the size and cost of chip sets for digital communications, and particularly for mobile digital communications.

SUMMARY

To decrease the memory required for storing an interleaving table, an interleaver according to the present invention uses a reduced interleaving table to generate interleaved output data blocks from input data blocks. By iteratively applying the reduced interleaving table to bits in the input data blocks, the interleaver generates one or more output data blocks equivalent to those that would have been generated using a conventional full-size interleaving table.

According to one embodiment of the present invention, the interleaving circuit includes a grouping circuit and a permuting circuit. The grouping circuit groups the bits of each data block into a plurality of sub-blocks, while the permuting circuit generates permuted sub-blocks by independently permuting the data bits in each sub-block using the reduced interleaving table. The interleaver may also include a mapping circuit that maps the bits from each permuted sub-block to an output data block. The bits in each output data block may comprise bits from different input data blocks.

In one exemplary embodiment, the interleaver may be used to interleave bits on the full-rate speech channel. According to this embodiment, the grouping circuit groups the 456 data bits of an input data block into 8 sub-blocks, where each sub-block includes 57 data bits. The permuting circuit permutes the bits in each sub-block using the reduced interleaving table to generate permuted sub-blocks. The mapping circuit maps the bits from the first four permuted sub-blocks to even positions in a first output data block, and maps the bits from the last four permuted sub-blocks to odd positions in a second output data block.

DETAILED DESCRIPTION

The present invention relates to wireless communications between a mobile communication device and a wireless network. While the following describes the present invention in terms of a single mobile communication device, those skilled in the art will appreciate that the present invention applies to multiple mobile communication devices that transmit and receive wireless signals within a wireless network.

Figure 1:
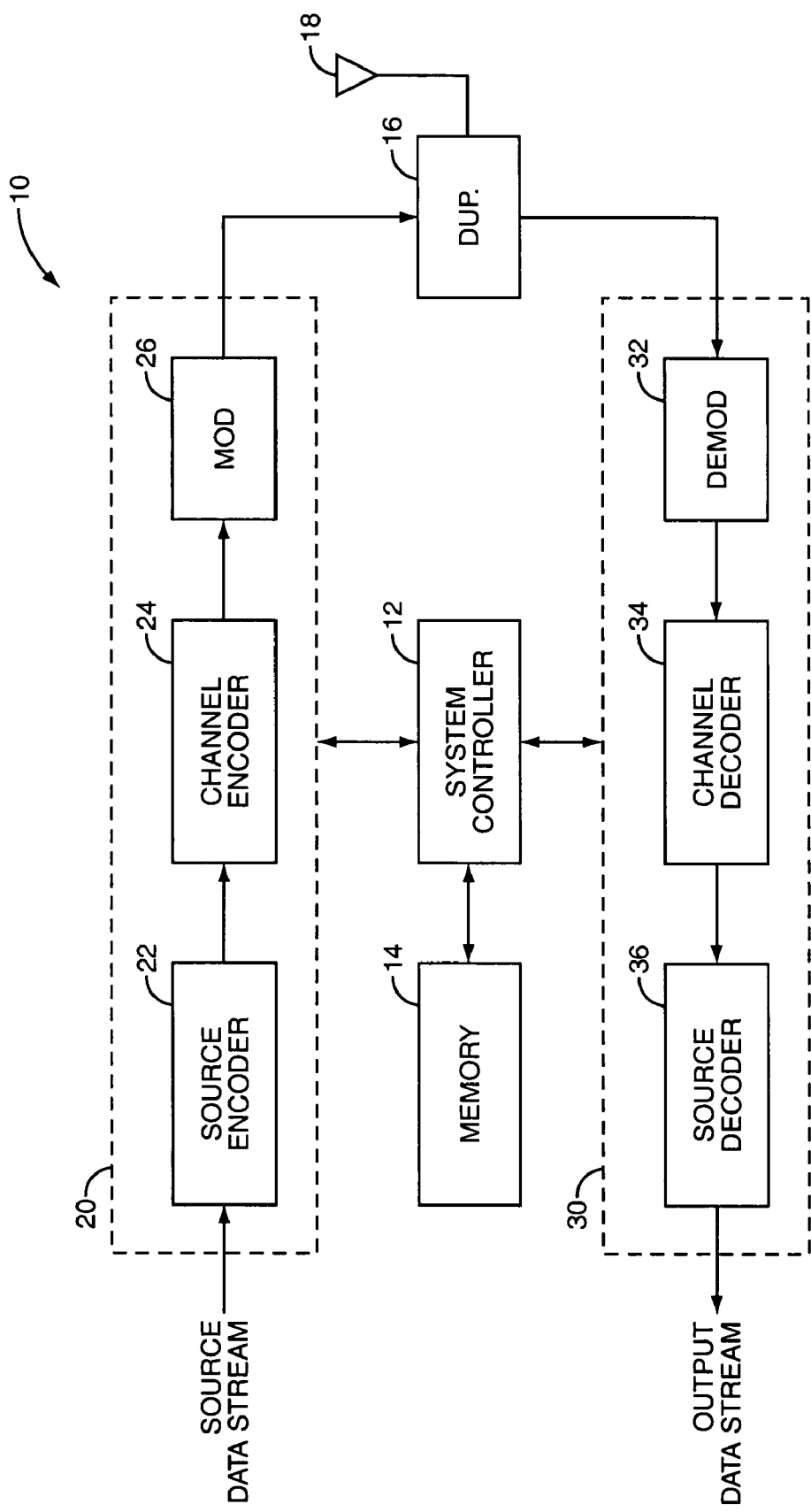
FIG. 1 illustrates a block diagram of a mobile communication device in which the channel encoder/decoder of the present invention could be used.

FIG. 1 illustrates a mobile communication device generally indicated by number 10. Mobile communication device 10 comprises a system controller 12 that controls the overall operation of the mobile communication device 10, a memory 14 to store programs and data needed for operation, a transmitter 20 to transmit signals, and a receiver 30 to receive signals. A duplexer or switch 16 couples transmitter 20 and receiver 30 to a common antenna 18 to permit full duplex operation.

Transmitter 20 receives source data streams from an information source, processes the source data streams to generate transmit signals suitable for transmission over a radio channel, and modulates the transmit signals onto an RF carrier. To that end, transmitter 20 includes a source encoder 22, a channel encoder 24, and a modulator 26. The source encoder 22 removes redundancy or randomizes the source data streams to produce information data blocks that have been optimized for maximum information content. For example, the source encoder 22 may comprise a speech encoder to encode speech for transmission over the communication channel. The information stream from the source encoder 22 is passed to the channel encoder 24. The channel encoder 24 introduces an element of redundancy into the information stream to generate a coded output. The redundancy added by the channel encoder 24 serves to enhance the error correction capability of the communication system. By making use of the redundant information, a receiver 30 can detect and correct bit errors that may occur during transmission. In addition, channel encoder 24 interleaves the coded bits to generate an interleaved output data block, i.e., an output data block. Modulator 26 receives and modulates a radio block (i.e., 116 bits) generated from the output data block (i.e., 114 bits) from the channel encoder 24 to generate waveforms that suit the physical nature of the communication channel and that can be efficiently transmitted over the communication channel. Typical modulation schemes comprise 16-QAM, 8-PSK, 4-PSK, and the like.

Receiver 30 receives signals transmitted from a far-end device that have been corrupted by passage through the communication channel, and reconstructs the original source data streams from the received signals. The receiver 30 includes a demodulator 32, channel decoder 34, and source decoder 36. Demodulator 32 processes the received signals and generates received bit sequences, which may comprise hard or soft values for each received bit. If a received signal is transmitted without error through the communication channel, the demodulated signal will be identical to the corresponding output data block at the output of channel encoder 24. In actual practice, the communication channel introduces bit errors into the received signals. Channel decoder 34 uses the redundancy added by the channel encoder 24 to detect and correct these bit errors. As a final step, a source decoder 36 reconstructs the information signals from the output of channel decoder 34. The difference between the reconstructed information signals and the original information signals provide a measure of the distortion introduced by the communication system.

Figure 2:
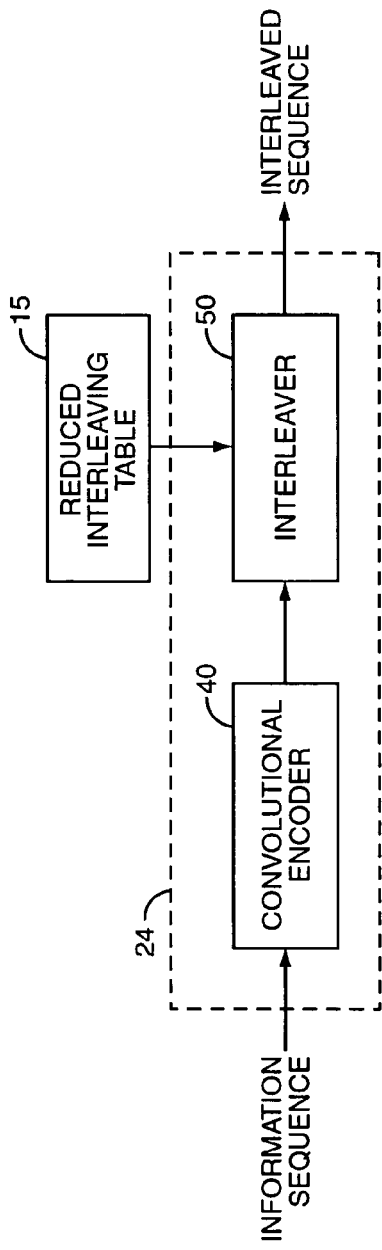
FIG. 2 illustrates a block diagram of an exemplary channel encoder according to the present invention.
Figure 3:
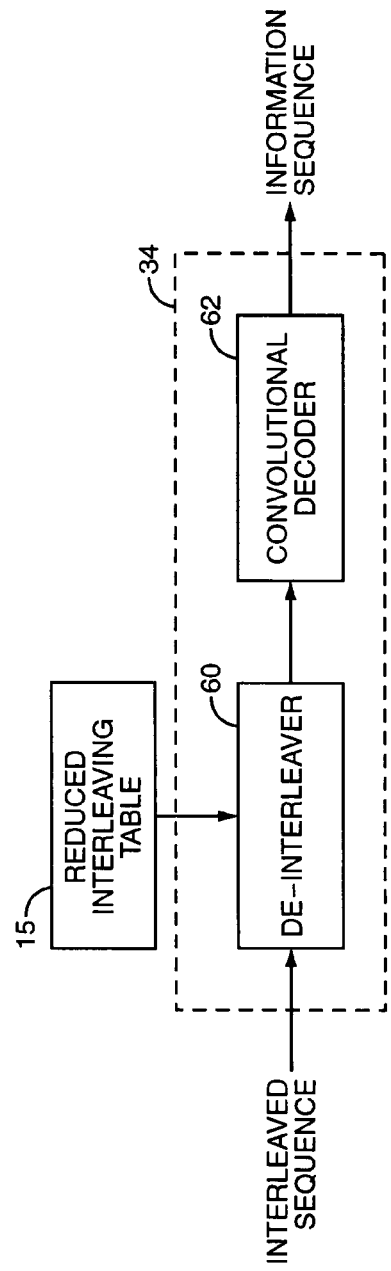
FIG. 3 illustrates a block diagram of an exemplary channel decoder according to the present invention.

FIGS. 2 and 3 illustrate an exemplary channel encoder 24 and decoder 34, respectively. Channel encoder 24 (FIG. 2) includes an encoder 40 to encode an information sequence provided by the source encoder 22, and an interleaver 50 to reorder the data block of coded bits output by encoder 40. The encoder 40 may, for example, comprise a convolutional encoder or block encoder. The interleaver 50 reorders the bits output by the encoder 40, as discussed further below, to spread the coded bits over time to render them more resistant to burst errors.

Channel decoder 34 (FIG. 3) comprises a de-interleaver 60 followed by a decoder 62. The de-interleaver 60 reverses the process performed by interleaver 50. In the absence of bit errors, the input sequence to the de-interleaver 60 would be the sequence output by interleaver 50. As such, the bits in the output data block from the de-interleaver 60 are the same as the coded bits output by the channel encoder 40 except for any bit errors that may have occurred during transmission. The output bit sequence from de-interleaver 60 is input to the decoder 62 for error detection and/or correction.

Conventional interleavers and de-interleavers perform the interleaving and de-interleaving processes using an interleaving algorithm (calculation method) or a full interleaving table (look-up table method). However, as discussed above, the calculation method is processor intensive and the look-up table method is memory intensive. The present invention balances the use of the processing and memory resources by iteratively using a reduced interleaving table 15 to facilitate the interleaving and de-interleaving processes, respectively. The "reduced interleaving table" represents an interleaving table with fewer values than the full interleaving table used in conventional interleavers. As such, the reduced interleaving table 15 requires less memory than a full interleaving table. By iteratively using the reduced interleaving table 15, interleaver 50 generates output data blocks equivalent to those that would be generated using a full interleaving table. While the following describes the present invention in the context of an interleaving operation performed by an interleaver 50, those skilled in the art would recognize that the same interleaving techniques may be used by the de-interleaver 60 at the receiver 30 to de-interleave received data blocks.

Figure 4:
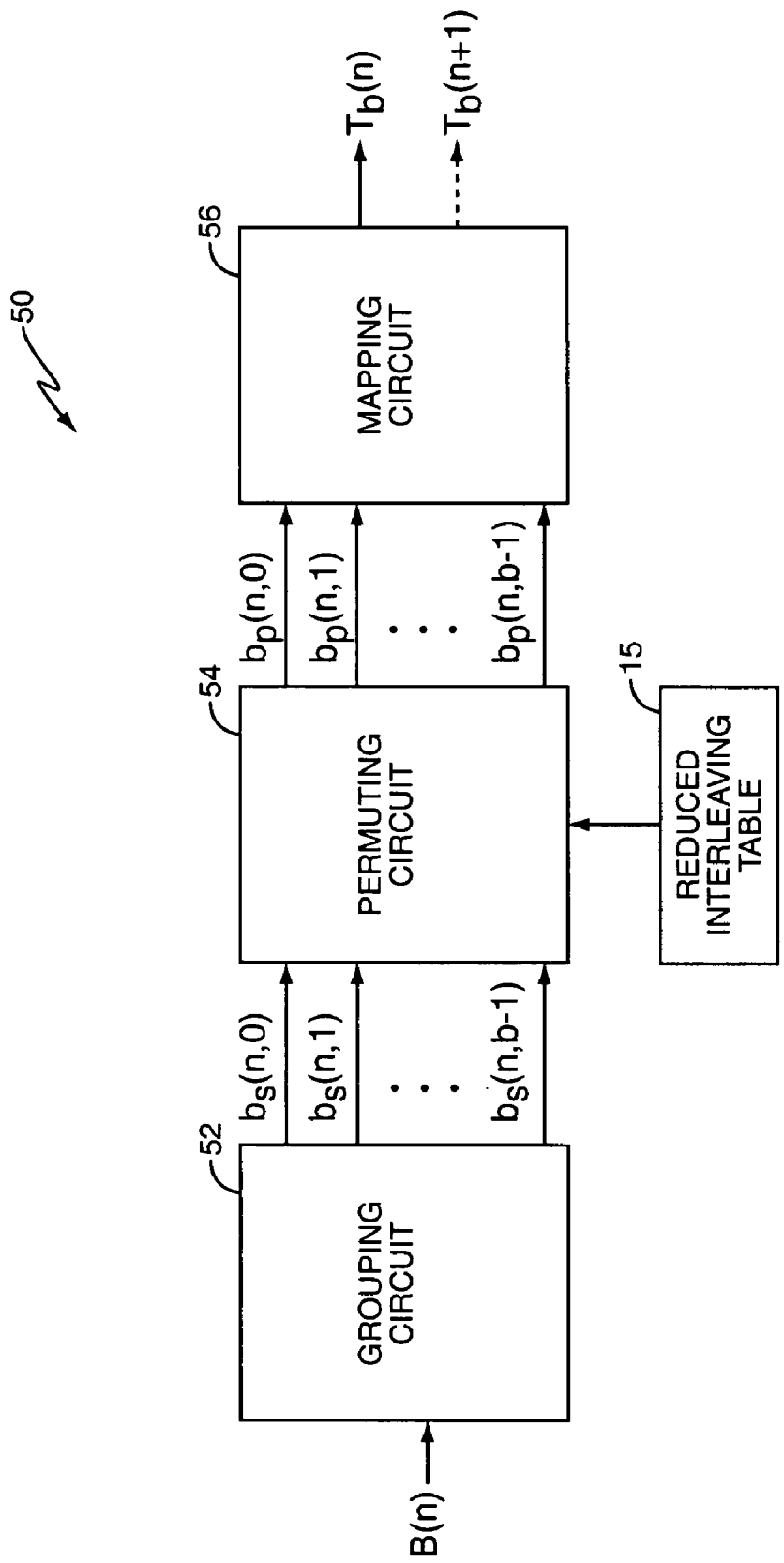
FIG. 4 illustrates a block diagram of an exemplary interleaver according to the present invention.
Figure 5:
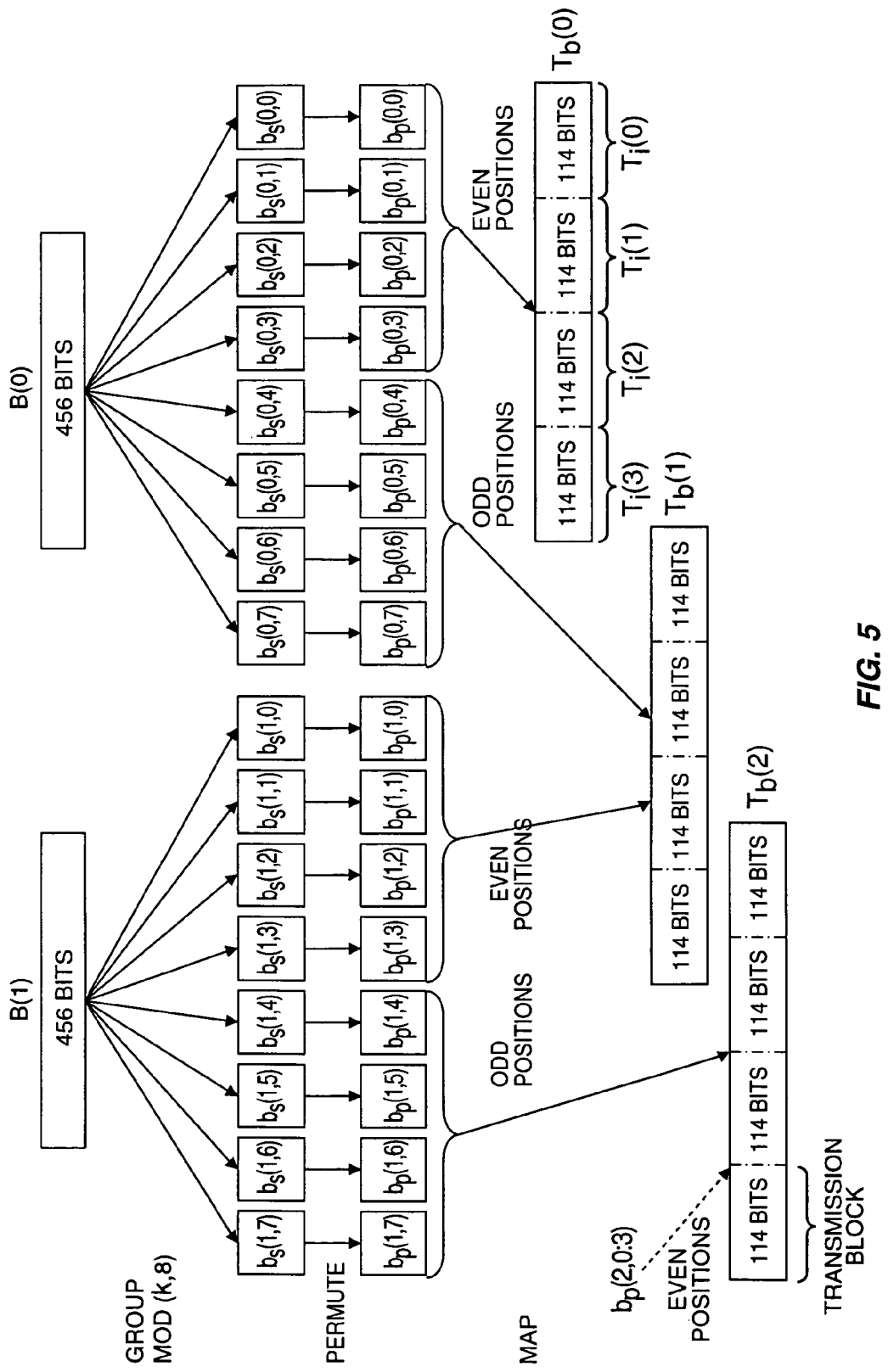
FIG. 5 illustrates a process diagram for the exemplary interleaver according to the present invention.
Figure 6:
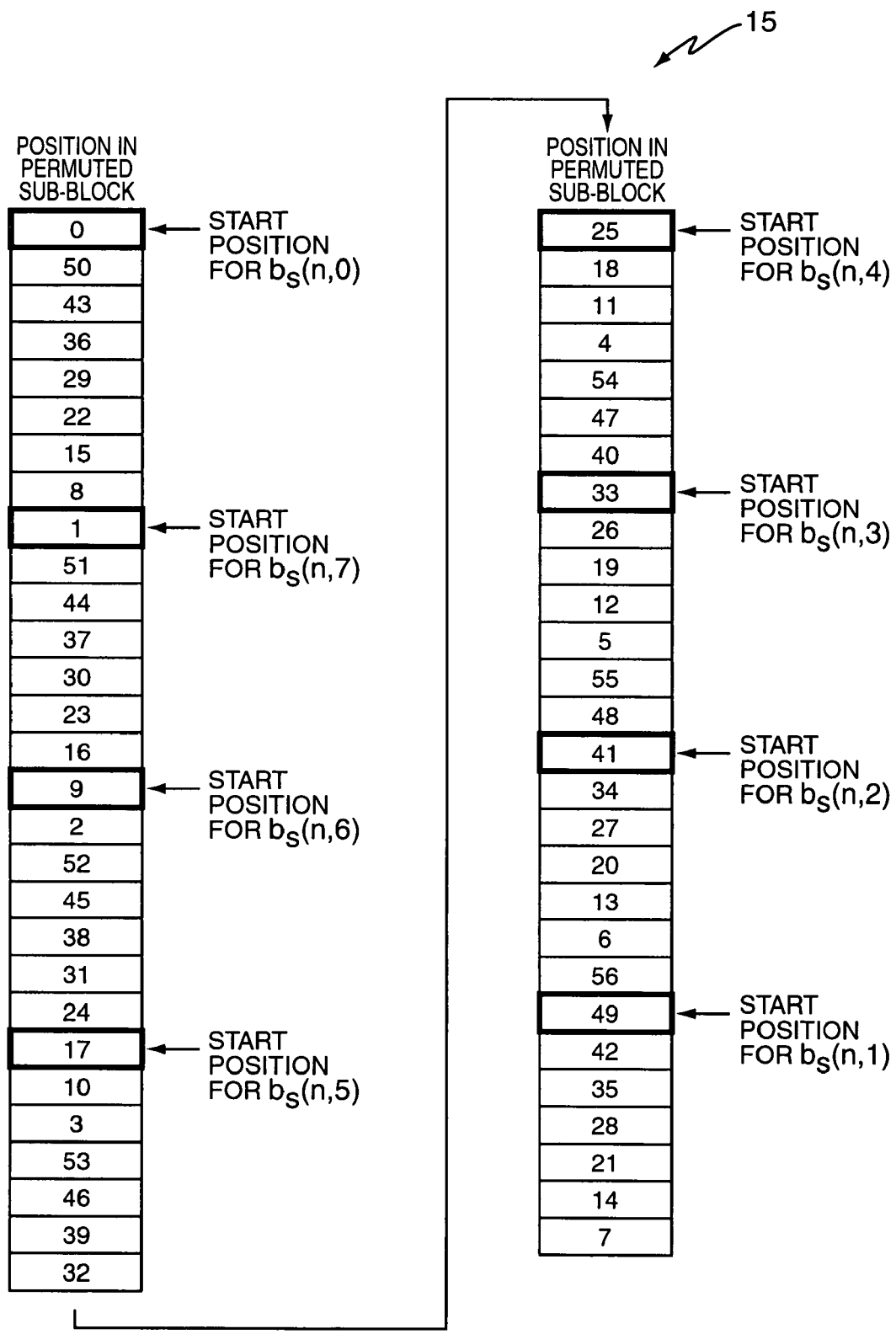
FIG. 6 illustrates an exemplary reduced interleaving table for the interleaver of the present invention.

FIG. 4 illustrates a block diagram for one exemplary interleaver 50 according to the present invention. Interleaver 50 comprises a grouping circuit 52, a permuting circuit 54, and a mapping circuit 56. Grouping circuit 52 groups the bits in the $n^{th}$ data block B(n) into b sub-blocks, $b_s$(n, 0:b−1), while permuting circuit 54 generates permuted sub-blocks $b_p$(n, 0:b−1) by independently permuting the bits in each sub-block using the reduced interleaving table 15. Mapping circuit 56 maps the bits in the permuted sub-blocks $b_p$(n, 0:b−1) to bit positions in one or more output data blocks $T_b$. To facilitate the following discussions, FIGS. 5-7 illustrate the interleaving process of the present invention for the full-rate speech channel in GSM systems. However, those skilled in the art will appreciate that interleaver 50 is not limited to this specific implementation or to these specific types of data blocks.

As shown in FIG. 5, the input data block for the full-rate speech channel comprises 456 bits. Grouping circuit 52 groups the bits sequentially from an input data block B(n) into b=8 sub-blocks $b_s$(n, 0:7). For bit position k in the input data block, the sub-block may be given by mod(k, 8). Permuting circuit 54 generates the permuted sub-blocks $b_p$(n, 0:7) by independently permuting the bits in each sub-block using reduced interleaving table 15, as discussed in further detail below. Mapping circuit 56 maps the bits in each permuted sub-block to one or more output data blocks $T_b$. According to one exemplary embodiment, shown in FIG. 5, mapping circuit 56 maps the bits in the first four permuted sub-blocks $b_p$(n, 0:3) corresponding to input data block n to even positions in a first output data block $T_b$(n), and maps the bits in the last four permuted sub-blocks $b_p$(n, 4:7) corresponding to input data block n to odd positions in a subsequent output data block $T_b$(n+1).

FIG. 6 illustrates an exemplary reduced interleaving table 15 applicable to GSM full-rate speech channels. Permuting circuit 54 applies the reduced interleaving table 15 to each sub-block generated by grouping circuit 52 to generate the permuted sub-blocks. In particular, permuting circuit 54 identifies a start position for each sub-block and applies the reduced interleaving table 15 to the sub-block from the corresponding starting position. If the end of the table is reached before completing the permuting operation, the permuting circuit 54 returns to the beginning of the reduced interleaving table 15 to continue the permuting process, as shown in FIG. 7B for $b_s$(n, 1).

Figure 7A:
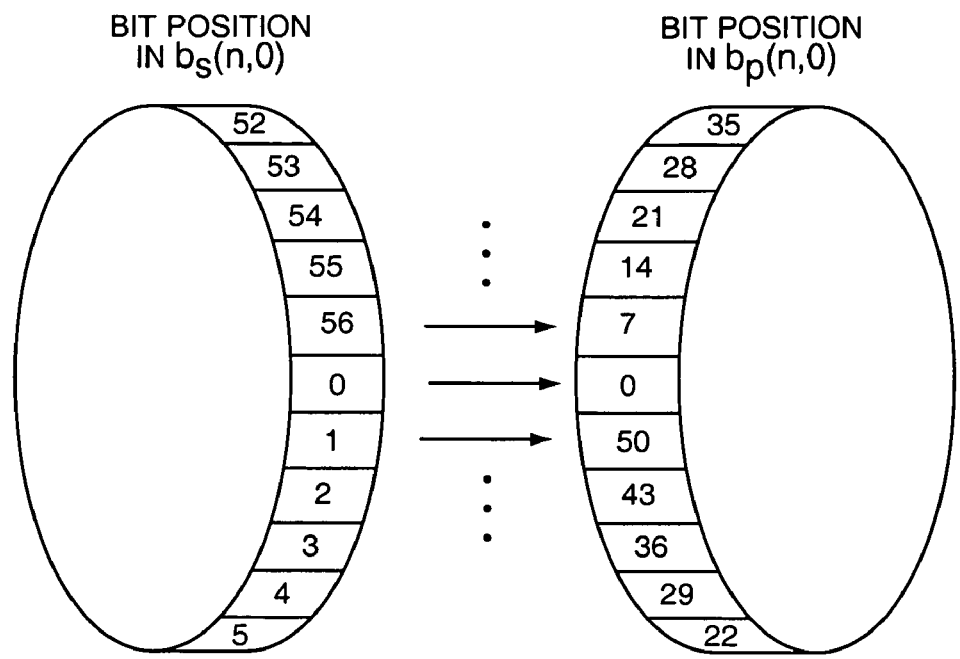
FIGS. 7A and 7B illustrate a graphical representation of an exemplary permuting process according to the present invention.
Figure 7B:
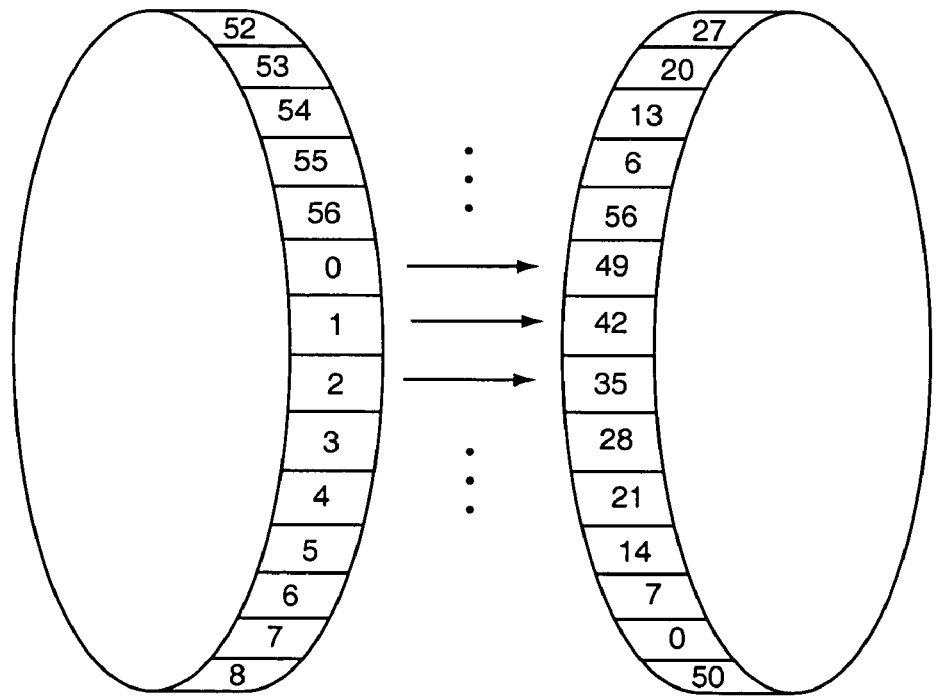

FIGS. 7A and 7B graphically illustrate the permuting process for the first and second sub-blocks of the $n^{th}$ input data block, $b_s(n, 0)$ and $b_s(n, 1)$. For $b_s(n, 0)$, permuting circuit 54 identifies table position 0 as the start position for $b_s(n, 0)$. As shown in FIG. 7A, permuting circuit 54 applies the permuting pattern in reduced interleaving table 15, starting from table position 0, to each bit in $b_s(n, 0)$ to generate the first permuted sub-block $b_p(n, 0)$. In particular, permuting circuit 54 moves the first bit in $b_s(n, 0)$ to bit position 0 in $b_p(n, 0)$, the second bit in $b_s(n, 0)$ to bit position 50 in $b_p(n, 0)$, etc. To permute the second sub-block $b_s(n, 1)$, permuting circuit 54 shifts the start position to apply the permuting pattern to each bit in $b_s(n, 1)$ starting from table position 50, as graphically shown in FIG. 7B. In particular, permuting circuit 54 movies the first bit in $b_s(n, 1)$ to bit position 49 in $b_p(n, 0)$, the second bit in $b_s(n, 0)$ to bit position 42 in $b_p(n, 0)$, etc. This process continues for each sub-block until permuting circuit 54 has independently permuted each of the sub-blocks for a given input data block.

After permuting circuit 54 completes the permuting operation, mapping circuit 56 maps the bits in the permuted sub-blocks $b_p(n, 0:7)$ to one or more output data blocks. As shown in FIG. 5, an exemplary output data block $T_b$ comprises four transmission bursts $T_i$, where each transmission burst contains 114 bits. In the exemplary embodiment shown in FIG. 5, mapping circuit 56 maps the bits in the first four permuted sub-blocks from a first permuted sub-block, $b_p(0, 0:3)$, to even bit positions in corresponding transmission bursts of the first output data block, $T_b(0)$. For example, mapping circuit 56 maps the bits from $b_p(0, 0)$ to the even bit positions in the first transmission burst $T_i(0)$, the bits from $b_p(0, 1)$ to the even bit positions in $T_i(1)$, etc. Mapping circuit 56 also maps the bits in the last four permuted sub-blocks $b_p(0, 4:7)$ to odd bit positions in the corresponding transmission bursts of the second output data block, $T_b(1)$. For example, mapping circuit 56 maps the bits from $b_p(0, 4)$ to the odd bit positions in the first transmission burst $T_i(0)$ of $T_b(1)$, the bits from $b_p(0, 5)$ to the odd bit positions in the second transmission burst $T_i(1)$ of $T_b(1)$, etc. Similarly, mapping circuit 56 maps the bits in the first four permuted sub-blocks of the second data block $b_p(1, 0:3)$ to even bit positions in the corresponding transmission bursts of the second output data block $T_b(1)$, and maps the bits in the last four permuted sub-blocks $b_p(1, 4:7)$ to odd bit positions in the corresponding transmission bursts of the third output data block $T_b(2)$. This process repeats for each data block as the transmitter sequentially transmits a modulated version of each output data block.

As discussed above, interleaver 50 uses a reduced interleaving table 15 to generate interleaved output data blocks equivalent to those generated by a conventional full interleaving table. The following explains in more detail how the reduced interleaving table 15 is derived from the full interleaving table.

A conventional full-rate speech interleaver may interleave the data bit in the $k^{th}$ position of the $n^{th}$ input data block B to the $j^{th}$ position in a $l_{th}$ transmission burst $T_i$ of a output data block $T_b$ according to:

$$T_i(l,j)=B(n,k), \text{ for } k=0, 1, 2, 3, \ldots, 452, 453, 454, 455, \tag{1}$$

$$\text{where } l=4n+\text{mod}(k,8) \text{ and} \tag{2}$$

$$j=2 \text{ mod}(49k,57)+\text{quotient}((\text{mod}(k,8)),4). \tag{3}$$

Equations (2) and (3) represent one example of a closed form block diagonal interleaving function. The first part of Equation (3) permutes the data and forces the interleaver to fill half of the output data block with interleaved bits from a current data block. The second part of Equation (3) determines if the bit in the $k^{th}$ position of the input data block goes into an even or an odd position in the output data block. To interleave the bits in a 456 data block, a conventional interleaving system requires an interleaving table derived from Equation (3), where the resulting interleaving table has 456 values, one for each of the bits in the input data block.

To reduce the size of the conventional interleaving table, the present invention separates the interleaving process into three independent steps: the grouping step performed by grouping circuit 52, the permuting step performed by permuting circuit 54, and the mapping step performed by mapping circuit 56, as shown in FIG. 5 and discussed above. It will be appreciated that grouping circuit 52 and mapping circuit 56 generally implement the second half of Equation (3), leaving the first half of Equation (3) for permuting circuit 54.

As shown in Equation (4), mod(49k,57) may be rewritten to reference the bit positions in the sub-blocks.

$$\text{mod}(49k,57)=\text{mod}((49(8m+b)+57),57) \tag{4}$$

In Equation (4), m=0, 1, ... 56 and represents the bit positions in the $b^{th}$ sub-block. Due to the modulo property of Equation (4), the permuting pattern generated for b=1 is an offset, repeated version of the permuting pattern generated for b=0. Similarly, Equation (4) generates a permuting pattern for b=2 that is also an offset, repeated version of the permuting pattern for b=1. This holds true for each of the sub-blocks. Therefore, the right hand side of Equation (4) generates a permuting pattern that repeats for each sub-block, where each repeated pattern is offset from the previous repeated pattern. By creating a reduced interleaving table out of the repeated pattern, and by designating a different start position within the reduced interleaving table for each sub-block, the present invention creates a reduced interleaving table that may be reused to independently permute each sub-block of an input data block, and that uses less memory than the full interleaving table of a conventional interleaving system.

The above describes a method and apparatus for interleaving bits of an input data block over 8 half-bursts (or two half-blocks). However, the present invention is not so limited. For example, the reduced interleaving table of the present invention may also be used in other control channel interleavers or in AMR (Adaptive Multi-Rate) interleavers to interleave data bits from an input data block over 4 half-transmission bursts (Variant I), over 6 transmission bursts (Variant II), or over 4 full-transmission bursts (Variant III).

Conventional interleavers interleave data over 4 half-transmission bursts (Variant I) according to:

$$T_i(b,j)=B(n,k), \text{ for } k=4, 5, 6, 7, 12, 13, 14, 15, \ldots, 452, 453, 454, 455, \tag{5}$$

$$\text{where } b=4n+\text{mod}(k,8)-4, \text{ and} \tag{6}$$

$$j=2 \text{ mod}(49k,57)+\text{quotient}((\text{mod}(k,8)),4). \tag{7}$$

Because Equation (7) is equivalent to Equation (3), the interleaver 50 of the present invention may use the reduced interleaving table 15 as discussed above to permute the bits in the sub-blocks generated by grouping circuit 52. However, for this embodiment, grouping circuit 52 groups the bits into 4 sub-blocks instead of 8 sub-blocks, where each sub-block comprises 57 bits. The permuting and mapping functions are the same as described above.

Conventional interleavers interleave data over 6 transmission bursts (Variant II) according to:

$$T_i(b,j)=B(n,k), \text{ for } k=0, 1, 2, 3, \ldots, 452, 453, 454, 455, \tag{8}$$

$$\text{where } b=4n+\text{mod}(k,8)-4 \text{ quotient}((\text{mod}(k,8)),6), \text{ and} \tag{9}$$

$$j=2\bmod(49k,57)+\text{quotient}((\bmod(k,8)),4). \quad (10)$$

The interleaving operation of Equations (8)-(10) interleaves half of the bits in the input data block into the even positions of 4 transmission bursts in a first output data block, and the remaining bits in the input data block into the odd positions of 4 transmission bursts in a second output data block. As part of the final interleaving process, the last two transmission bursts from the first output data block are combined with the last two transmission bursts of the second output data block to form 2 full transmission bursts in between the remaining 4 half transmission bursts.

As with the Variant I, the interleaver 50 of the present invention may use the same reduced interleaving table 15 discussed above to implement Variant II because Equation (10) is equivalent to Equation (3). Further, grouping circuit 52 and permuting circuit 54 perform the same grouping and permuting processes described above. However, for this variant, mapping circuit 56 performs a slightly different mapping process than described above. More particularly, mapping circuit 56 maps bits from $b_p(n, 0:1)$ to even positions in the first two transmission bursts of the first output data block and maps bits from $b_p(n, 4:5)$ to odd positions in the first two transmission bursts of the second output data block. In addition, mapping circuit 56 maps bits from $b_p(n, 2:3)$ to even positions in the last two transmission bursts of the first output data block, and maps bits from $b_p(n, 6:7)$ to odd positions in the last two transmission bursts of the first output data block.

Conventional interleavers interleave data over 4 full transmission bursts (Variant III) according to:

$$T_i(b,j)=B(n,k),\text{ for }k=0,1,2,3,\ldots,452,453,454,455, \quad (11)$$

$$\text{where } b=4n+\bmod(k,4),\text{ and} \quad (12)$$

$$j=2\bmod(49k,57)+\text{quotient}((\bmod(k,8)),4). \quad (13)$$

Again, because Equation (13) is equivalent to Equation (3), the interleaver 50 of the present invention may use the same reduced interleaving table 15 discussed above. Further, grouping circuit 52 groups the input data bits into 8 sub-blocks using a modulo process, and permuting circuit 54 permutes the data bits in the sub-blocks using reduced interleaving table 15, as discussed above. However, in this embodiment, mapping circuit 56 maps the bits from the first four permuted sub-blocks to even positions in the corresponding transmission bursts of an output data block, and maps the bits from the last four permuted sub-blocks to odd positions in the corresponding transmission bursts of the same output data block.

The above describes using a reduced interleaving table 15 to interleave data bits in an input data block. The exemplary reduced interleaving table 15 described above includes 57 values. Because the conventional interleaving table includes 456 values, the present invention reduces the memory requirements for the interleaving table by at least a factor of 8. Further, because memory 14 reserves 16 bits for each interleaving table value and because the values s in reduced interleaving table 15 require only 6 bits, additional memory savings may be achieved by combining two values into one 16 bit word. As a result, memory 14 only needs to store 27 words to store the entire reduced interleaving table 15.

Further memory savings may be realized if memory 14 stores a compressed version of the reduced interleaving table. For example, memory 14 may store only the first 8 values (0, 50, 43, 36, 29, 22, 15, and 8) of reduced interleaving table 15 as seed values. According to this embodiment, permuting circuit 54 recreates the reduced interleaving table 15 from the 8 stored seed values as part of the permuting process. For example, permuting circuit 54 may recreate the reduced interleaving table 15 according to the following pseudo-code:

```
seed = {0, 50, 43, 36, 29, 22, 15, and 8}
for i = 0 to 6 {
    for j = 0 to 7 {
        RIT [8*i + j] = seed [j] + i
    }
}
RIT(56) = 7
end
```

It will be appreciated that other forms of recreating the reduced interleaving table 15 from seed values may also be implemented.

The interleaver 50 of the present invention provides a better balance between memory and processing resources when compared to conventional interleavers. First, a conventional interleaver performs two operations on each input data bit (interleave and shift), while the interleaver of the present invention performs three operations on each input data bit (grouping, permuting, and mapping). As such, the present invention increases the processing requirements of the interleaving operation only by a factor of 1.5. In addition, the memory requirements for reduced interleaving table 15 are reduced at least by a factor of 8. As such, the interleaver of the present invention significantly reduces the memory requirements of an interleaving process with minimal impact to the processing resources of the transmitter 24. In addition, the reduced interleaving table may be used by a single transceiver to implement different interleaving processes, such as any of the embodiments and/or variants described above.

The above generally describes the interleaver in terms of a full-rate speech channel. Together with the variants discussed above, this interleaver can also process control channels, including FACCH, SACCH, and SACCH/TP. This interleaver can also process an adjustable rate multi-channel (ARM), including ONSET and SID-Update channels. The interleaver described above also applies to E-FACCH for an enhanced circuit-switched data mode, and to GPRS CS1-4 channels and for EGPRS MCS1-4 channels. Generally, the interleaver of the present invention applies to any interleaving process that includes a block diagonal interleaving process defined by a closed-form interleaving function.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

I claim:

1. A method implemented by a communication device of interleaving data bits to be transmitted over a communication channel for channel coding by said communication device, the method comprising:

storing in said communication device a reduced interleaving table having fewer values than an input data block provided by an information source of the communication device; and interleaving the data bits in the input data block by iteratively applying the reduced interleaving table to the data bits to generate the output data block.

2. The method of claim 1 wherein interleaving the data bits comprises:
grouping the data bits of the input data block into a plurality of sub-blocks; and
generating permuted sub-blocks by applying the reduced interleaving table to the data bits in each sub-block to independently permute the data bits in each sub-block.

3. The method of claim 2 further comprising identifying a start position in the reduced interleaving table for each sub-block.

4. The method of claim 3 wherein identifying the start position comprises identifying a different start position for each sub-block, wherein the identified start positions are evenly distributed through the reduced interleaving table.

5. The method of claim 3 wherein applying the reduced interleaving table to the data bits in each sub-block comprises applying the reduced interleaving table from each identified start position to the data bits in the corresponding sub-block.

6. The method of claim 5 wherein applying the reduced interleaving table to the data bits in each sub-block further comprises wrapping from an end of the reduced interleaving table to a beginning of the reduced interleaving table when applying the reduced interleaving table from a start position that differs from the beginning of the reduced interleaving table.

7. The method of claim 2 wherein interleaving the data bits further comprises mapping the data bits from each permuted sub-block to one or more output data blocks.

8. The method of claim 7 wherein mapping the permuted data bits comprises:
mapping the data bits from a first number of the permuted sub-blocks to even positions in a first output data block; and
mapping the data bits from a second number of the permuted sub-blocks to odd positions in the first output data block.

9. The method of claim 7 wherein mapping the permuted data bits comprises:
mapping the data bits from a first number of the permuted sub-blocks to even positions in a first output data block; and
mapping the data bits from a second number of the permuted sub-blocks to odd positions in a second output data block.

10. The method of claim 9 further comprising
grouping data bits from a second data block into a second plurality of sub-blocks;
generating a second set of permuted sub-blocks by applying the reduced interleaving table to the data bits in each of the second plurality of sub-blocks to independently permute the data bits in each of the second plurality of sub-blocks;
mapping the data bits from a first number of the second plurality of permuted sub-blocks to even positions in the second output data block; and
mapping the data bits from a second number of the second plurality of permuted sub-blocks to odd positions in a third output data block.

11. The method of claim 10 further comprising formatting the output data blocks according to a predefined communication standard.

12. The method of claim 2 wherein the input data block comprises a 456-bit data block.

13. The method of claim 12 wherein grouping the data bits comprises grouping the data bits of the input data block into 8 sub-blocks, wherein each sub-block includes 57 bits from the input data block.

14. The method of claim 12 wherein grouping the data bits comprises grouping the data bits of the input data block into 4 sub-blocks, wherein each sub-block includes 57 bits from the input data block.

15. The method of claim 12 wherein storing the reduced interleaving table comprises storing a reduced interleaving table having 57 values.

16. The method of claim 1 wherein the input data block comprises a data block for at least one of a full-rate speech channel, an adjustable multi-rate channel, a control channel for GSM, and for GPRS and EGPRS channels.

17. The method of claim 1 wherein storing the reduced interleaving table comprises storing a compressed version of the reduced interleaving table.

18. The method of claim 17 further comprising recreating the reduced interleaving table based on the compressed version of the reduced interleaving table.

19. The method of claim 1 wherein interleaving the data bits comprises interleaving the data bits in the input data block according to a modulo interleaving process.

20. The method of claim 1 wherein interleaving the data bits comprises implementing different interleaving processes to interleave the data bits in one or more input data blocks using the same reduced interleaving table.

21. An interleaver in a communication device, said interleaver configured to interleave data bits to be transmitted over a communication channel for channel coding by said communication device, the interleaver comprising:
memory for storing a reduced interleaving table having fewer values than the an input data block provided by an information source of the communication device; and
an interleaving circuit configured to interleave the data bits in the input data block by iteratively applying the reduced interleaving table to the data bits to generate the output data block.

22. The interleaver of claim 21 wherein the interleaving circuit comprises:
a grouping circuit configured to group the data bits of the input data block into a plurality of sub-blocks; and
a permuting circuit configured to generate permuted sub-blocks by applying the reduced interleaving table to the data bits in each sub-block to independently permute the data bits in each sub-block.

23. The interleaver of claim 22 wherein the permuting circuit is further configured to identify a start position in the reduced interleaving table for each sub-block.

24. The interleaver of claim 23 wherein the permuting circuit is configured to identify a different start position for each sub-block, wherein the identified start positions are evenly distributed through the reduced interleaving table.

25. The interleaver of claim 23 wherein the permuting circuit is configured to apply the reduced interleaving table from each identified start position to the data bits in the corresponding sub-block.

26. The interleaver of claim 25 wherein the permuting circuit is configured to wrap from an end of the reduced interleaving table to a beginning of the reduced interleaving table when applying the reduced interleaving table from a start position that differs from the beginning of the reduced interleaving table.

27. The interleaver of claim 22 wherein the interleaving circuit further comprises a mapping circuit configured to map the permuted bits from each sub-block to one or more output data blocks.

28. The interleaver of claim 27 wherein the mapping circuit is configured to:

map the permuted data bits from a first number of the sub-blocks to even positions in a first output data block; and map the permuted data bits from a second number of the sub-blocks to odd positions in the first output data block.

29. The interleaver of claim 27 wherein the mapping circuit is configured to:

map the data bits from a first number of the permuted sub-blocks to even positions in a first output data block; and map the data bits from a second number of the permuted sub-blocks to odd positions in a second output data block.

30. The interleaver of claim 29 wherein the grouping circuit is further configured to group data bits from a second input data block into a second plurality of sub-blocks, wherein the permuting circuit is further configured to generate a second set of permuted sub-blocks by applying the reduced interleaving table to the data bits in each of the second plurality of sub-blocks to independently permute the data bits in each of the second plurality of sub-blocks, and wherein the mapping circuit is further configured to:

map the data bits from a first number of the second plurality of permuted sub-blocks to even positions in the second output data block; and map the data bits from a second number of the second plurality of permuted sub-blocks to odd positions in a third output data block.

31. The interleaver of claim 22 wherein the data block includes 456 data bits.

32. The interleaver of claim 31 wherein the grouping circuit is configured to group the data bits of the input data block into 8 sub-blocks, wherein each sub-block comprises 57 bits from the input data block.

33. The interleaver of claim 31 wherein the grouping circuit is configured to group the data bits of the input data block into 4 sub-blocks, wherein each sub-block comprises 57 bits from the input data block.

34. The interleaver of claim 31 wherein the memory stores a reduced interleaving table having 57 values.

35. The interleaver of claim 21 wherein the input data block comprises a data block for at least one of a full-rate speech channel, an adjustable multi-rate channel, a control channel for GSM, and for GPRS and EGPRS channels.

36. The interleaver of claim 21 wherein the memory stores a compressed version of the reduced interleaving table.

37. The interleaver of claim 36 wherein the interleaving circuit is further configured to recreate the reduced interleaving table based on the compressed version of the reduced interleaving table.

38. The interleaver of claim 21 wherein the interleaving circuit is configured to interleave the data bits of the input data block according to a modulo interleaving process.

39. The interleaver of claim 21 wherein the interleaving circuit is a de-interleaving circuit.

40. The interleaver of claim 21 wherein the interleaving circuit is configured to interleave the data bits in one or more input data blocks according to different interleaving processes using the same reduced interleaving table.

41. A method implemented by a communication device of de-interleaving data bits in a data block received by said communication device via a communication channel for channel decoding by said communication device, the method comprising:

storing in said communication device a reduced interleaving table having fewer values than the received data block; and de-interleaving the data bits in the received data block by iteratively applying the reduced interleaving table to the data bits to generate the output data block.

42. The method of claim 41 wherein de-interleaving the data bits comprises:

un-mapping the data bits in the received data block to generate one or more permuted sub-blocks;

generating one or more un-permuted sub-blocks by independently applying the reduced interleaving table to the data bits in each permuted sub-block; and un-grouping the un-permuted sub-blocks into the data bits of the one or more output data blocks.

43. A de-interleaver in a communication device, said de-interleaver configured to de-interleave interleaved data bits in a data block received by said communication device via a communication channel for channel decoding by said communication device, the de-interleaver comprising:

memory for storing a reduced interleaving table having fewer values than the received data block; and an interleaving circuit configured to de-interleave the data bits in the received data block by iteratively applying the reduced interleaving table to the data bits to generate the output data block.

44. The interleaver of claim 43 wherein the interleaving circuit comprises:

a mapping circuit configured to un-map the data bits in the received data block to generate one or more permuted sub-blocks;

a permuting circuit configured to generate one or more un-permuted sub-blocks by independently applying the reduced interleaving table to the data bits in each permuted sub-block; and a grouping circuit configured to un-group the data bits of the un-permuted sub-blocks into the data bits of the one or more output data blocks.

* * * * *